United States Patent [19]
Farley

[11] Patent Number: 5,470,649
[45] Date of Patent: Nov. 28, 1995

[54] COMPOSITE WITH THROUGH THE THICKNESS REINFORCEMENT

[75] Inventor: Gary L. Farley, Yorktown, Va.

[73] Assignee: The United States of America as represented by the Adminstrator of the National Aeronautics and Space Administration, Washington, D.C.

[21] Appl. No.: 265,361

[22] Filed: Jun. 24, 1994

[51] Int. Cl.⁶ ............................ B32B 17/02; B32B 17/04
[52] U.S. Cl. .................. 428/303; 428/224; 428/227; 428/234; 428/246; 428/408; 428/902; 428/923; 428/924
[58] Field of Search .................. 264/25; 428/223, 428/228, 224, 227, 234, 246, 303, 408, 902, 923, 924

[56] References Cited

U.S. PATENT DOCUMENTS

| | | | |
|---|---|---|---|
| 4,271,222 | 6/1981 | Hahn | 428/193 |
| 4,337,218 | 6/1982 | Byrd et al. | 264/3 R |
| 4,572,700 | 2/1986 | Mantarro et al. | 404/35 |
| 4,828,897 | 5/1989 | Staneluis et al. | 428/71 |
| 4,888,228 | 12/1989 | Sidles | 428/86 |
| 5,093,171 | 3/1992 | Sheahan | 428/61 |
| 5,102,723 | 4/1992 | Pepin | 428/223 |

Primary Examiner—Patrick J. Ryan
Assistant Examiner—Richard C. Weisberger
Attorney, Agent, or Firm—Kimberly A. Chasteen

[57] ABSTRACT

A laminated composite material with improved interlaminar strength and damage tolerance having short rods distributed evenly throughout the composite material perpendicular to the laminae. Each rod is shorter than the thickness of the finished laminate, but several times as long as the thickness of each lamina. The laminate is made by inserting short rods in layers of prepreg material, and then stacking and curing prepreg material with rods inserted therethrough.

2 Claims, 2 Drawing Sheets

COMPOSITE WITH THROUGH THE THICKNESS REINFORCEMENT

ORIGIN OF THE INVENTION

The invention described herein was made in the performance of work done by an employee of the U.S. Government and may be manufactured and used by or for the government for governmental purposes without the payment of any royalties thereon or therefor.

BACKGROUND OF THE INVENTION

1. Field of the Invention

This invention relates in general to composite materials, and specifically to laminated composite materials with improved interlaminar strength.

2. Description of the Related Art

Laminated composite materials are widely used as construction materials in applications covering the range from printed circuit boards to aircraft skin. Typically, laminated composite materials are made by arranging a number of thin sheets of reinforcing material impregnated with an uncured binder in a stack, and then compressing the stack while the binder is cured by heat or other means. Each lamina of reinforcing material impregnated with an uncured binder is commonly called a "prepreg". The cured binder in the finished material is commonly referred to as the "matrix".

Laminated composite materials are susceptible to damage and delamination induced failures due to low interlaminar and intralaminar strength. Interlaminar and intralaminar damage can occur, for example, when runway debris impacts the skin of an aircraft during landing, or a tool is dropped on the aircraft during ground servicing. The mechanical properties of both the matrix and the reinforcing fiber control the interlaminar or intralaminar response mechanisms of a composite laminate, but it is primarily the mechanical properties at the interface between adjacent plies that control the interlaminar response.

Three methods are commonly used to improve the damage tolerance of composite materials: 1) adding a compliant layer between lamina in the laminate, 2) using a high failure strain matrix, and 3) inserting through-the-thickness (TTT) reinforcement in a laminate. It has yet to be conclusively proven which technique is best for improving the overall damage tolerance of laminated composite materials. It is likely that no single technique is universally optimal.

Compliant material between layers of composite material in a laminate allows relative movement between adjacent layers of composite material, and thereby reduces the interlaminar stresses along the interface of the compliant layer and the composite material. There are several techniques for adding a compliant layer between composite lamina. One technique is to place a layer of compliant film between composite lamina. Another technique is to add small compliant particles, such as small rubber spheres, between the layers of composite materials. Usually, the compliant film or compliant particles are applied to individual lamina during the fiber impregnation ("prepregging") process. These techniques are equally applicable to fabric, unidirectional tape and single yarn material forms. In general, the compliant material does not change the processing or handling qualities of the prepreg material. The compliant layer approach for improving damage tolerance is, however, not applicable to all composite material systems. For example, most organic matrix materials for elevated temperature applications are incompatible with the compliant layer techniques for toughening composite materials. Matrix materials for elevated temperature applications usually exhibit low failure strains which requires the designer to use a conservative design approach. The compliant layer also causes a reduction in the laminate fiber volume fraction, which proportionately reduces the in-plane mechanical properties of the composite laminate.

A high failure strain matrix, such as thermoplastic, also allows relative movement of adjacent layers. In this case the relative motion is due to the high strain capability of the matrix. High strain matrices and fibers also allow greater straining of a layer. Composite materials with compliant layers or composite materials of high failure strains are sometimes referred to as toughened composite materials. High strain matrix materials that have high stiffness are generally more expensive than high strain matrix materials that have lower stiffness. However, the high strain and high stiffness matrix materials are more difficult to process.

Through-the-thickness ("TTT") reinforcement increases the interlaminar strength and, to a limited extent, increases the intralaminar strength of the laminate thereby increasing the damage tolerance of a material. There are many types of through-the-thickness reinforcement and insertion methods. For example, stitching and tufting have been successfully applied to dry fiber preforms prior to resin infiltration and processing into composite laminates as a method of improving damage tolerance.

While stitching or tufting of dry fiber preforms improve damage tolerance, it has significant costs associated with it. Nominal stitch densities are between 60 and 160 per square inch. Using a single needle stitching machine requires between 1 and 3 minutes to stitch a one square inch region. When this process is applied to an entire wing skin or fuselage of an aircraft, it is obvious that considerable time and hence cost are involved in stitching. Furthermore, the preform can be damaged from the stitching/tufting process and from preform handling when it is transferred from the stitching/tufting tooling to the infiltration and cure tooling. The automated stitching/tufting machines, the infiltration equipment, and the development of resins compatible with the infiltration process are all costly. Most of the resins that can be infiltrated into dry fiber preforms have mechanical properties substantially inferior to those of the state-of-the-art toughened resins ordinarily used with prepreg materials. These inferior mechanical properties adversely affect the load carrying ability of the composite.

Through-the-thickness (TTT) reinforcements have also been applied to composite laminates composed of prepreg material. While stitching and tufting techniques have met with little success, the insertion of metal and composite rods as TTT reinforcement has been successfully applied to multilayer stacks of prepreg material.

One known method for insertion of rods into a stack of prepregs requires the forming of small diameter holes using a hollow ultrasonic needle, and then inserting a rod, either metallic or composite, through the hollow needle into the stack of prepreg. This process is repeated across the surface of the prepreg stack until the desired density of TTT reinforcement is obtained. The rods typically extend from the upper to the lower surface of the prepreg stack. Although this discontinuous reinforcement improves the damage tolerance of the composite material, currently this technique is labor intensive and economically impractical.

Another technique for inserting rods through the thickness of stacks of composite prepreg is by a foam block transfer method. Discontinuous rods are first inserted through the thickness of a layer of foam. After stacking the layers of prepreg, the rod filled foam block is placed on the surface of the prepreg stack. The assembly of prepreg laminate and foam block is bagged in the conventional manner and cured. As the temperature increases in the cure cycle, the foam softens and the viscosity of the resin decreases. When pressure is applied in the cure process the foam collapses and the rods are forced into the composite laminate. A substantial cost is incurred in making the rod filled foam layers, and the collapsed remains of a foam block may be unacceptable as a residue on a composite material. Further, the foam block transfer method is not readily applicable to co-cured, built-up structures such as stiffened panels.

SUMMARY OF THE INVENTION

Accordingly, it is an object of the present invention to provide a laminated composite material with improved interlaminar and intralaminar strength that can be used in a wide range of applications.

It is a further object of the present invention to provide a laminated composite material with through-the-thickness reinforcement that is less costly than known materials.

It is a still further object of the present invention to provide an inexpensive method for making a laminated composite material with through-the-thickness reinforcement.

These and other objects are achieved by a laminated composite material with a predetermined thickness comprising a number of rods substantially shorter than the thickness of the composite material arranged substantially parallel to the thickness of the composite material and distributed substantially evenly throughout the volume of the composite material.

A method according to the present invention for making a composite material comprises the steps of providing a sufficient number of uncured laminae of reinforcing material impregnated by an uncured matrix material to form a composite material of predetermined finished thickness, selecting a number of the uncured laminae, providing a source of thin rods, inserting a number of rods shorter than the finished thickness of the composite material perpendicularly through each of the selected laminae, layering all of the uncured laminae on top of each other to form a stack with the laminae having rods inserted evenly distributed in the stack, compressing the stack of layered uncured laminae, and curing the stack of layered laminae to form a dense composite material.

BRIEF DESCRIPTION OF THE DRAWINGS

The present invention and the objects achieved by it will be understood from the description herein, with reference to the accompanying drawings, in which.

DETAILED DESCRIPTION OF A PREFERRED EMBODIMENT

Figure 1:
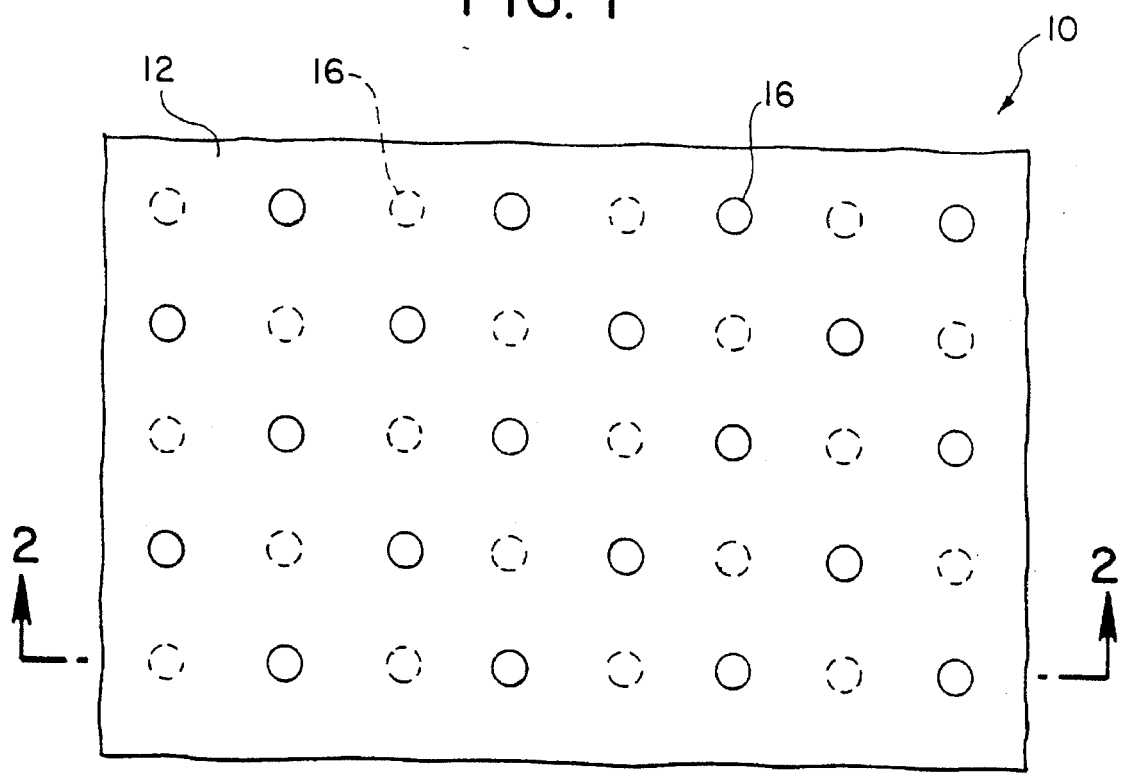
FIG. 1 is an enlarged top view of a small piece of composite material according to a preferred embodiment of the invention.
Figure 2:
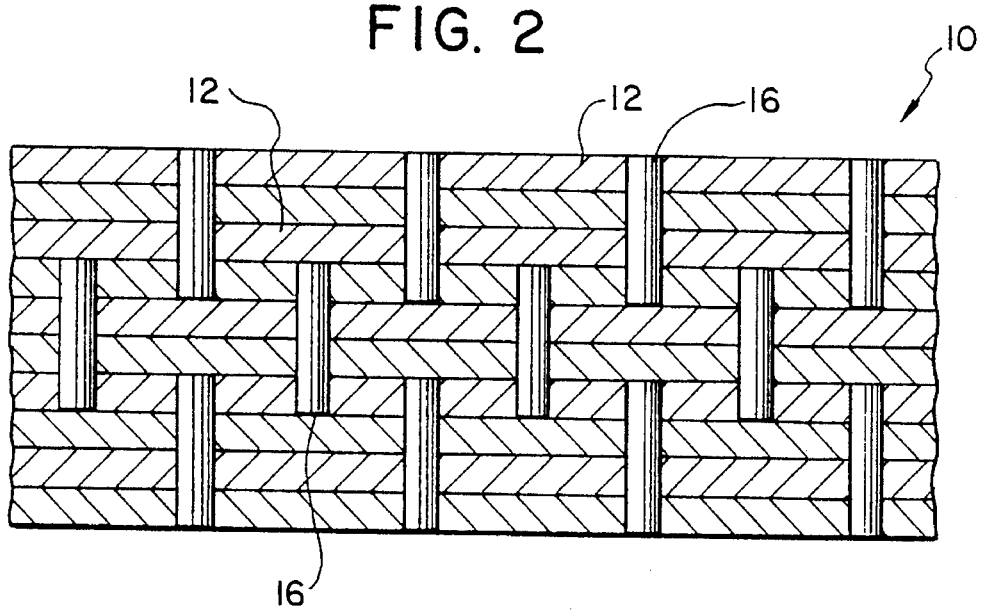
FIG. 2 is a sectional view taken along line 2—2 in FIG. 1.

FIG. I is an enlarged top view of a small piece of laminated composite material 10 according to a preferred embodiment of the present invention. FIG. 2 is a sectional view along line 2—2 in FIG. 1. The laminated composite material 10 consists of a number of laminae 12 of reinforcing material, e.g. woven fibers of graphite, in a matrix of cured resin, e.g. epoxy.

According to the preferred embodiment of the invention, a number of short rods 16 are included in the laminate. These rods are arranged perpendicular to the plane of each laminae 12. Each rod 16 is shorter than the total thickness of the laminate 10, but several times as long as the thickness of each lamina 12. The rods 16, accordingly, do not extend through the entire thickness of the laminate 10, but rather form discontinuous through-the-thickness reinforcements between laminae 12, and thereby increase the interlaminar strength of the composite material 10. The rods 16 may be made, for example, from metal or from composite material.

The short rods 16 are preferably evenly distributed throughout the volume of the finished composite material 10, such that some rods 16 are in the middle of the laminate, remote from both the top and the bottom surface of the laminate 10, as is clearly seen from FIG. 2. This distinguishes the composite material according to the invention from known materials with through-the-thickness rod reinforcement wherein the rods are always inserted from one or both sides of a finished laminate, or a stack of prepregs. The rods in these known materials accordingly extend from one or both sides of the finished laminate, and usually through the full thickness of the laminate.

Figure 3:
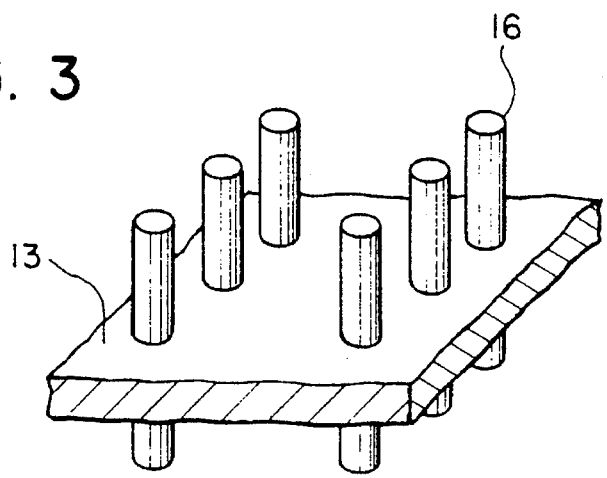
FIG. 3 is an enlarged perspective view of a small piece of a single prepreg for a composite material with short rods inserted.
Figure 4:
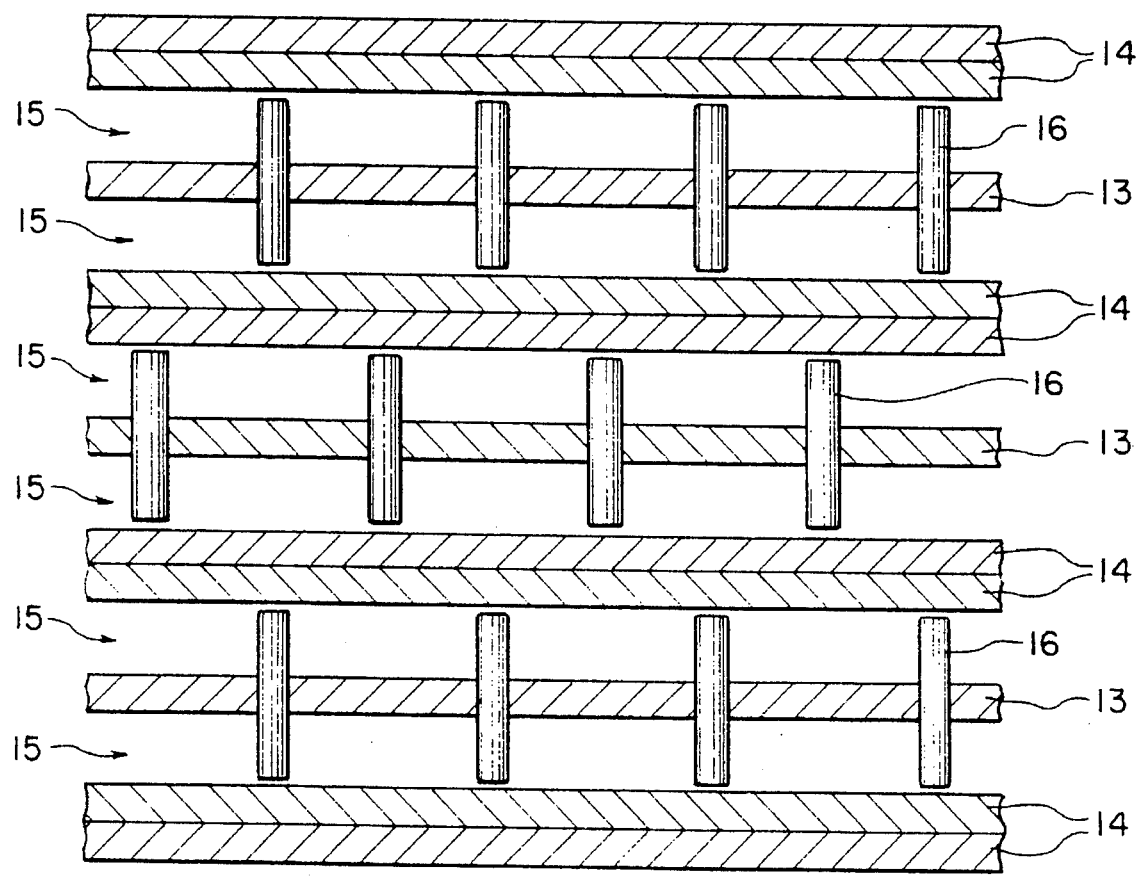
FIG. 4 is an enlarged section of a stack of prepregs with discontinuous through-the-thickness rods according to the invention before the stack is compressed and cured.

A manufacturing method for a laminated composite material 10 with discontinuous through-the-thickness rods 16 is illustrated in FIGS. 3 and 4. Basically, the process involves the lay-up of a sufficient number of prepreg sheets 13, 14 to form a laminate 10 of desired finished thickness. Short rods 16 are inserted in some or all of the individual prepreg sheets 13 during the lay-up process.

A number of short rods 16 are inserted through the thickness of individual sheets of prepreg material 13. The prepreg material 13 is soft and pliable, so little force is required to insert the rods 16 through the prepreg material 13. The ends of the rods stick out at each side of the prepreg material 13 as shown in FIG. 3. The rods 16 may, for instance, be inserted by pushing one end of a continuous strand of wire or composite through the prepreg material 13, and then cutting off the strand at a predetermined distance from the penetrating end such that a short rod 16 is formed.

Layers of prepreg 13, with rods 16 inserted, are assembled into laminates using the same automated and hand lay-up techniques used for conventional prepreg and towpreg materials. When layers of prepreg 13 with rods 16 inserted are stacked together, possibly interleaved with layers of prepreg material 14 without rods as shown in FIG. 4, the rod 16 reinforcements penetrate into neighboring layers. Partial penetration of neighboring layers occur during the prepreg lay-up process. Complete penetration by the rod 16 reinforcements occurs during debulking operations and when the laminate 10 is cured. When the prepreg stack is heated during the cure process the viscosity of the resin decreases and the rods 16 are forced into the adjacent layers of the laminate. The rods 16 can not penetrate the top and bottom surfaces of the curing press, however, so the rods 16 are contained within the interior of the finished laminate, which ensures a smooth top and bottom surfaces, as shown in FIG.

2. Because the rods 16 are incorporated during the prepregging process, this through-the-thickness reinforcement method can be used with a wide variety of prepreg materials.

The length, the diameter, the insertion pattern, and the spacing of the rods 16 are functions of the requirements of the end application. The lateral distance between the rods 16 will vary with the diameter of the rods 16 and the interlaminar strength required. The area density of the rods 16, which is defined as the total rod 16 cross section per unit area of laminate 10, typically varies between 0.1% and 3%.

Each lamina 12, in a laminated composite material 10, typically has a thickness between 0.05 mm and 0.25 min. The diameter of the rods 16 will typically vary from a few μm to about 0.2 min. The views shown in FIGS. 1–4 are accordingly greatly enlarged views of the actual laminate and lay-up process.

In the manufacturing process according to the invention the rods 16 penetrate into neighboring layers 12, but do not extend through the entire thickness of the laminate, unlike reinforcements made by stitching or tufting, or by previous methods for inserting discontinuous rods. The use of the short rods 16 results in increased interlaminar strength and, to some extent, increased intralaminar strength.

The invention offers several improvements over prior art methods for improving the interlaminar strength and damage tolerance of laminated composites. Compliant interlayers cannot be used in all composite laminates. For example, the mechanical properties of some compliant layers degrade with increasing temperature and are not readily applicable to high temperature applications. A material according to the present invention is, in contrast, useful for high temperature applications.

Through-the-thickness reinforcement is an effective method of suppressing interlaminar damage. However, conventional TTT reinforcing techniques are not practical for many resins because these resins are not infiltrateable into dry fiber preforms due to their high viscosity. The proposed invention is compatible with a broad range of resins because it is applied during the prepregging operation. The TTT reinforced prepreg according to the invention also has an advantage over alternate methods of improving damage tolerance in that the properties of the TTT reinforcement can be readily tailored to achieve the desired level of damage tolerance.

Through-the-thickness reinforced prepreg according to the invention further has the advantage over other TTT reinforcement techniques in that no new technology needs to be developed in the application of this method to conventional materials. The high cost associated with robotic stitching/tufting machines, resin infiltration processes, higher performance infiltrateable resins, or custom stitching/tufting tooling can be eliminated. Through-the-thickness reinforced prepreg according to the invention can also be used in existing prepreg and towpreg lay-up processes.

No substantial increase in prepreg cost will be incurred with the method according to the invention, because the cost of the rods 16 is on the order of the cost of compliant layer material. Also, the rod insertion process can be performed in line with the existing prepregging operation, so it will not significantly impede existing production rates.

Numerous modifications and adaptations of the present invention will be apparent to those skilled in the art. Thus, the following claims are intended to cover all such modifications and adaptations which fall within the true spirit and scope of the present invention.

What is claimed is:

1. A laminated composite material having a predetermined thickness, comprising: a plurality of rods wherein the rods are of a diameter ranging from 1 micron to about 2 mm and have lengths shorter than the total thickness of the composite material but several times as long as the thickness of each lamina of the composite material, arranged substantially parallel to the thickness of the composite material and distributed substantially evenly throughout the volume of the composite material.

2. A composite material having a predetermined finished thickness, comprising:
   (a) a stack of reinforced laminae bonded together in a matrix; and
   (b) a plurality of rods, said rods having diameters ranging from about 1 micron to about 2 mm, having a length substantially less than said finished thickness, but several times as long as the thickness of each lamina, said rods being arranged substantially perpendicular to the laminae and distributed substantially evenly throughout the composite material.

* * * * *